US008390787B2

(12) United States Patent
Gui et al.

(10) Patent No.: US 8,390,787 B2
(45) Date of Patent: *Mar. 5, 2013

(54) LITHOGRAPHIC APPARATUS AND DEVICE MANUFACTURING METHOD

(75) Inventors: Cheng-Qun Gui, Best (NL); Pieter Willem Herman De Jager, Rotterdam (NL); Robert-Han Munning Schmidt, Hapert (NL)

(73) Assignee: ASML Netherlands B.V., Veldhoven (NL)

(*) Notice: Subject to any disclaimer, the term of this patent is extended or adjusted under 35 U.S.C. 154(b) by 938 days.

This patent is subject to a terminal disclaimer.

(21) Appl. No.: 11/733,327

(22) Filed: Apr. 10, 2007

(65) Prior Publication Data
US 2007/0242246 A1  Oct. 18, 2007

Related U.S. Application Data

(63) Continuation of application No. 11/018,927, filed on Dec. 22, 2004, now Pat. No. 7,202,939.

(51) Int. Cl.
G03B 27/72 (2006.01)
G03B 27/42 (2006.01)
G03B 27/54 (2006.01)

(52) U.S. Cl. ............... 355/69; 355/53; 355/67
(58) Field of Classification Search .......... 355/52, 355/53, 55, 67–69; 359/291–292
See application file for complete search history.

(56) References Cited

U.S. PATENT DOCUMENTS

| | | | |
|---|---|---|---|
| 5,229,872 A | 7/1993 | Mumola | |
| 5,296,891 A | 3/1994 | Vogt et al. | |
| 5,500,736 A | 3/1996 | Koitabashi et al. | |
| 5,523,193 A | 6/1996 | Nelson | |
| 5,530,482 A | 6/1996 | Gove et al. | |
| 5,579,147 A | 11/1996 | Mori et al. | |
| 5,677,703 A | 10/1997 | Bhuva et al. | |
| 5,808,797 A | 9/1998 | Bloom et al. | |
| 5,982,553 A | 11/1999 | Bloom et al. | |
| 6,133,986 A * | 10/2000 | Johnson | 355/67 |
| 6,177,980 B1 | 1/2001 | Johnson | |

(Continued)

FOREIGN PATENT DOCUMENTS

| JP | 05-502141 A | 4/1993 |
|---|---|---|
| JP | 5-259026 A | 10/1993 |

(Continued)

OTHER PUBLICATIONS

Translation of Notification of Reasons for Refusal for Japanese Patent Application No. 2005-367343 mailed Oct. 28, 2008, 5 pgs.

(Continued)

*Primary Examiner* — Hung Henry Nguyen
(74) *Attorney, Agent, or Firm* — Sterne, Kessler, Goldstein & Fox P.L.L.C.

(57) ABSTRACT

A lithographic apparatus comprises an illumination system for supplying a beam of radiation, a patterning arrangement incorporating an array of individually controllable elements for imparting a pattern to the beam cross-section, a substrate table for supporting a substrate, and a projection system incorporating a microlens array for projecting the beam onto a target portion of the substrate. An error compensator is provided for supplying error correction values for compensating for the effect of positional errors in the microlens array, and a grey scale modulator is provided for supplying drive signals to controllable elements of the patterning arrangement in dependence on the error correction values in order to compensate for the effect of positional errors in the microlens array by varying the intensity of some parts of the pattern relative to other parts of the pattern.

22 Claims, 8 Drawing Sheets

U.S. PATENT DOCUMENTS

| | | | |
|---|---|---|---|
| 6,687,041 B1 * | 2/2004 | Sandstrom | 359/291 |
| 6,747,783 B1 * | 6/2004 | Sandstrom | 359/290 |
| 6,795,169 B2 | 9/2004 | Tanaka et al. | |
| 6,806,897 B2 | 10/2004 | Kataoka et al. | |
| 6,811,953 B2 | 11/2004 | Hatada et al. | |
| 6,844,920 B2 * | 1/2005 | Luellau | 355/67 |
| 6,870,554 B2 | 3/2005 | Jain | |
| 6,870,601 B2 | 3/2005 | Liebregts et al. | |
| 6,897,941 B2 | 5/2005 | Almogy | |
| 7,088,468 B1 | 8/2006 | Thurén | |
| 7,106,490 B2 * | 9/2006 | Sandstrom | 359/290 |
| 7,202,939 B2 * | 4/2007 | Gui et al. | 355/69 |
| 7,508,570 B1 * | 3/2009 | Meisburger | 359/290 |
| 2005/0007572 A1 | 1/2005 | George et al. | |

FOREIGN PATENT DOCUMENTS

| | | |
|---|---|---|
| JP | 2001-500628 A | 1/2001 |
| JP | 2001-513219 A | 8/2001 |
| JP | 2002-512702 A | 4/2002 |
| JP | 2002-367900 A | 12/2002 |
| JP | 2002-372406 A | 12/2002 |
| JP | 2006-502558 A | 1/2006 |
| WO | WO 97/34171 A1 | 9/1997 |
| WO | WO 98/33096 A1 | 7/1998 |
| WO | WO 98/38597 A2 | 9/1998 |
| WO | WO 98/38597 A3 | 9/1998 |
| WO | WO 03/040830 A2 | 5/2003 |

OTHER PUBLICATIONS

English Abstract for JP 5-502141T published Apr. 15, 1993, Furaunhoofuaa G, 1 pg.

English Abstract for JP 2006-502558T published Jan. 19, 2006, Applied Materials Inc., 1 pg.

English Abstract for JP 2001-513219T published Aug. 28, 2001, Micronics Laser Systems AB, 1 pg.

English Abstract for JP 2002-512702T published Apr. 23, 2002, Micronics Laser Systems AB, 1 pg.

English-Language Abstract for Japanese Patent Publication No. 05-502141 A, published Apr. 15, 1993; 2 pages.

English-Language Abstract for Japanese Patent Publication No. 2002-512702 A, published Apr. 23, 2002; 1 page.

Non-Final Rejection mailed Jun. 16, 2006 for U.S. Appl. No. 11/018,927, filed Dec. 22, 2004; 7 pages.

Notice of Allowance mailed Nov. 28, 2006 for U.S. Appl. No. 11/018,927, filed Dec. 22, 2004; 4 pages.

* cited by examiner

LITHOGRAPHIC APPARATUS AND DEVICE MANUFACTURING METHOD

CROSS REFERENCE TO RELATED APPLICATIONS

The present application is a continuation of non-provisional U.S. application Ser. No. 11/018,927, "Lithographic Apparatus and Device Manufacturing Method", filed Dec. 22, 2004, now issued as U.S. Pat. No. 7,202,939 B2.

BACKGROUND

1. Field of the Invention

The present invention relates to a lithographic apparatus and a device manufacturing method.

2. Related Art

A lithographic apparatus is a machine that applies a desired pattern onto a target portion of a substrate. The lithographic apparatus can be used, for example, in the manufacture of integrated circuits (ICs), flat panel displays, and other devices involving fine structures. In a conventional lithographic apparatus, a patterning means, which is alternatively referred to as a mask or a reticle, can be used to generate a circuit pattern corresponding to an individual layer of the IC (or other device), and this pattern can be imaged onto a target portion (e.g., comprising part of one or several dies) on a substrate (e.g., a silicon wafer or glass plate) that has a layer of radiation-sensitive material (e.g., resist). Instead of a mask, the patterning means can comprise an array of individually controllable elements that generate the circuit pattern.

In general, a single substrate will contain a network of adjacent target portions that are successively exposed. Known lithographic apparatus include steppers, in which each target portion is irradiated by exposing an entire pattern onto the target portion in one go, and scanners, in which each target portion is irradiated by scanning the pattern through the beam in a given direction (the "scanning" direction), while synchronously scanning the substrate parallel or anti-parallel to this direction.

The sequence of exposures, or shots, forms a printed pattern. When considering maskless lithography, each shot results from an image of a spatial light modulator (SLM) array being projected onto a photosensitive surface, such as a layer of photoresist on a wafer substrate. This results in deposition of a dose, or a quantity of irradiation from a light source, within a certain exposure zone on this surface. Exposure zones are created when the substrate surface is illuminated by flashes of light from the light source.

In a pixel grid imaging lithographic system utilizing a micro lens array (MLA), the MLA is one of the most critical optical components in the system. The MLA focuses patterned beam projected by the projection lenses so as to form a large array of image spots in the image plane, which coincides with the photoresist layer on the substrate surface. For optimal resolution of the projected image the image spots should be very accurately located, for example within about 20 nm relative to the idea grid in the XY plane and within a few microns (e.g., +/− 3 microns) in the focal direction. This small tolerance can lead to errors. These errors can be randomly distributed and can be magnification errors in the X direction or in the Y direction or in both the X and Y directions, or can be positional errors of the order of about 0.1 to 1 micron.

However, it is extremely difficult to manufacture MLA's that are capable of generating image spots having position errors of less than about 20 nm, and currently there are no techniques available to permit correction of position errors in the XY plane to the required level of accuracy.

Therefore, what is needed is a system and method that at least partially compensate for an effect of manufacturing errors in a MLA when used for focusing a patterned beam projected onto a target portion of a substrate.

SUMMARY

According to one embodiment of the present invention, there is provided a lithographic apparatus comprising an illumination system, a patterning arrangement, a projection system, an error compensator, and a gray scale modulator. The illumination system supplies a beam of radiation. The patterning arrangement patterns the beam. The projection system projects the beam onto a target portion of a substrate. The error compensator supplies error correction values for compensating for the effect of errors in the projection system. The grey scale modulator supplies drive signals to the patterning arrangement based on the error correction values in order to compensate for the effect of errors in the projection system by varying the intensity of some parts of the pattern.

In accordance with one embodiment of the present invention, there is provided a device manufacturing method comprising the following steps. Imparting a pattern to a beam using an adjustable patterning arrangement. Projecting the patterned beam of radiation onto a target portion of a substrate. Providing error correction values for compensating for the effect of errors in the projection system. Supplying drive signals to the patterning arrangement based on the error correction values in order to compensate for the effect of errors in the projection system by varying the intensity of some parts of the pattern.

In one example, the patterning arrangement can comprise an array of individually controllable elements. The grey scale modulator can be arranged to vary the intensity of radiation transmitted by at least some of the controllable elements of the array in order to compensate for the effect of errors in the projection system.

In one example, each of the individually controllable elements has a grey scale in intensity of, for example, 256 levels.

In one example, the projection system incorporates a micro lens array for producing image spots on the target portion of the substrate.

Further embodiments, features, and advantages of the present inventions, as well as the structure and operation of the various embodiments of the present invention, are described in detail below with reference to the accompanying drawings.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIGS. 4, 5, 6, and 7 show an effect of imaging spot position errors, according to various embodiments of the present invention.

Figure 8:
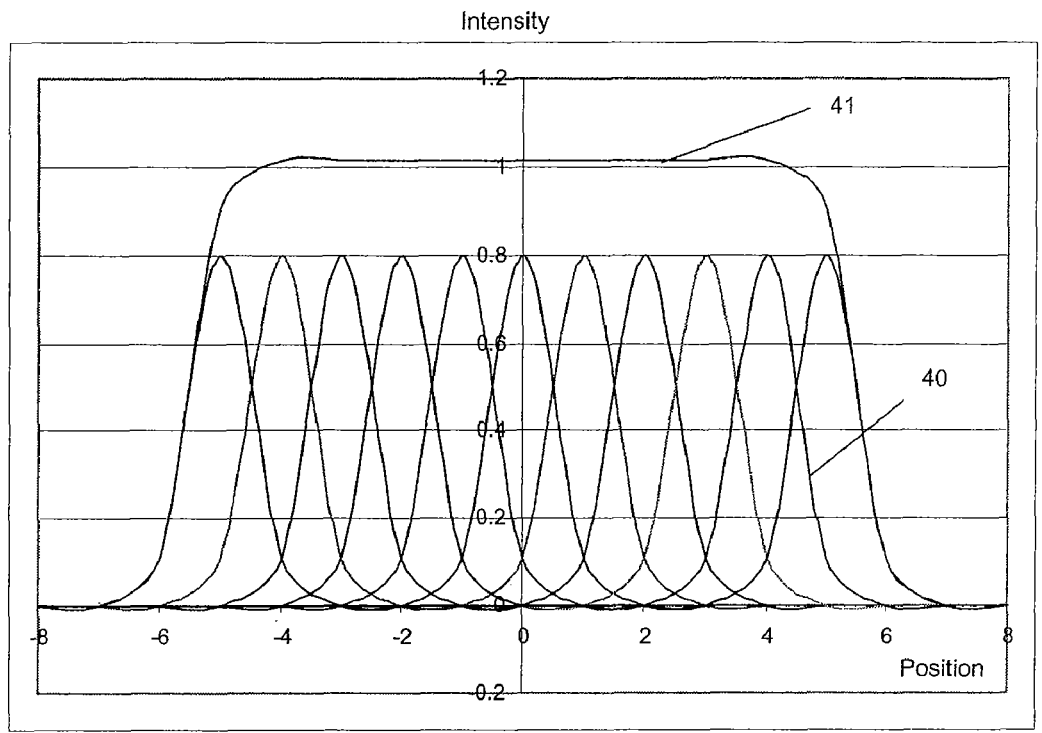

FIG. 8 is a graph showing an intensity of an array of imaging spots having no position errors, according to one embodiment of the present invention.

Figure 9:
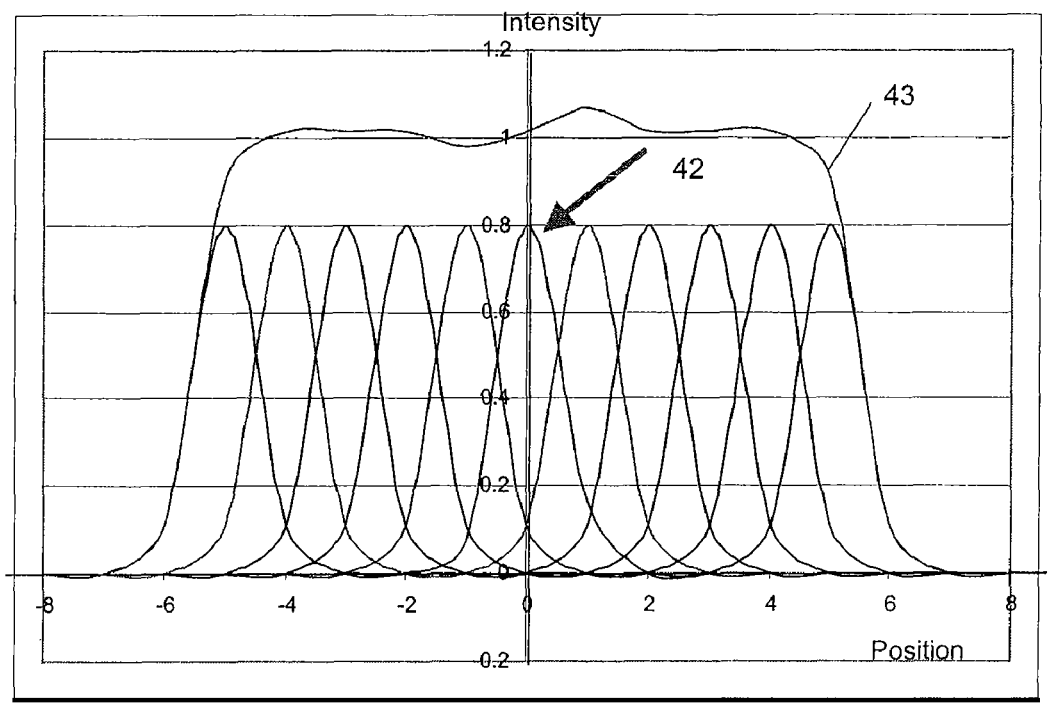

FIG. 9 is a graph showing an intensity of an array of imaging spots with one spot having a position error, according to one embodiment of the present invention.

Figure 10:
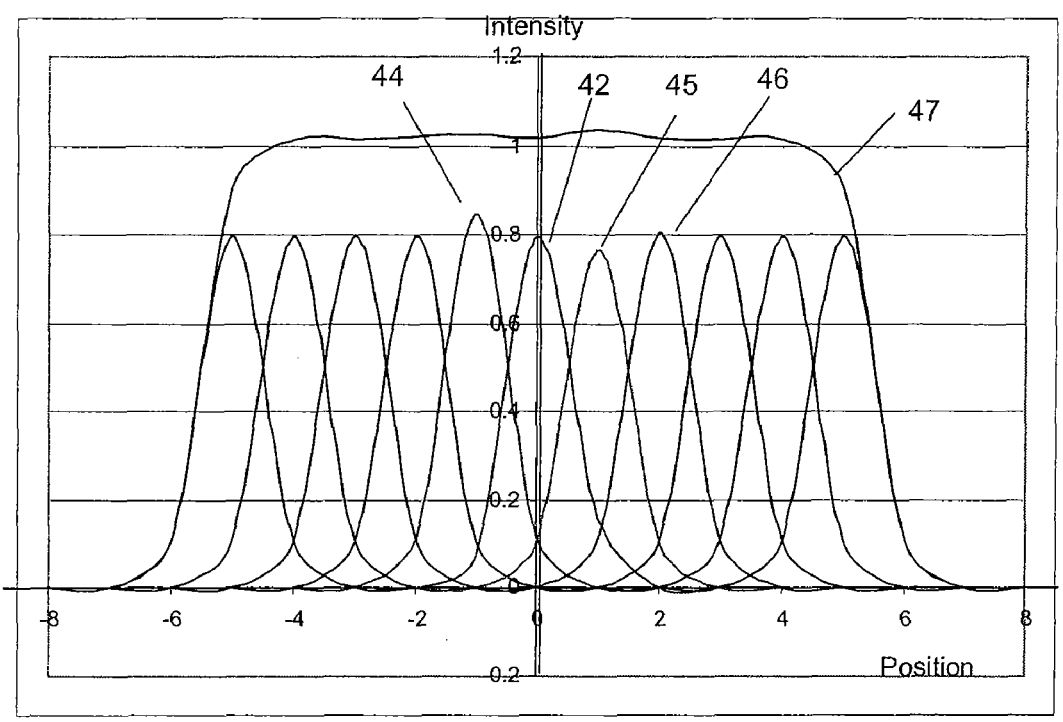

FIG. 10 is a graph showing the intensity of an array of imaging spots in which a spot position error has been compensated for, according to one embodiment of the present invention.

The present invention will now be described with reference to the accompanying drawings. In the drawings, like reference numbers can indicate identical or functionally similar elements.

DETAILED DESCRIPTION OF THE EMBODIMENTS

Overview and Terminology

Although specific reference can be made in this text to the use of lithographic apparatus in the manufacture of integrated circuits (ICs), it should be understood that the lithographic apparatus described herein can have other applications, such as the manufacture of integrated optical systems, guidance and detection patterns for magnetic domain memories, flat panel displays, thin-film magnetic heads, micro and macro fluidic devices, etc. The skilled artisan will appreciate that, in the context of such alternative applications, any use of the terms "wafer" or "die" herein can be considered as synonymous with the more general terms "substrate" or "target portion," respectively. The substrate referred to herein can be processed, before or after exposure, in for example a track (e.g., a tool that typically applies a layer of resist to a substrate and develops the exposed resist) or a metrology or inspection tool. Where applicable, the disclosure herein can be applied to such and other substrate processing tools. Further, the substrate can be processed more than once, for example, in order to create a multi-layer IC, so that the term substrate used herein can also refer to a substrate that already contains multiple processed layers.

The term "array of individually controllable elements" as here employed should be broadly interpreted as referring to any device that can be used to endow an incoming radiation beam with a patterned cross-section, so that a desired pattern can be created in a target portion of the substrate. The terms "light valve" and "Spatial Light Modulator" (SLM) can also be used in this context. Examples of such patterning devices are discussed below.

A programmable mirror array can comprise a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate spatial filter, the undiffracted light can be filtered out of the reflected beam, leaving only the diffracted light to reach the substrate. In this manner, the beam becomes patterned according to the addressing pattern of the matrix-addressable surface.

It will be appreciated that, as an alternative, the filter can filter out the diffracted light, leaving the undiffracted light to reach the substrate. An array of diffractive optical micro electrical mechanical system (MEMS) devices can also be used in a corresponding manner. Each diffractive optical MEMS device can include a plurality of reflective ribbons that can be deformed relative to one another to form a grating that reflects incident light as diffracted light.

A further alternative embodiment can include a programmable mirror array employing a matrix arrangement of tiny mirrors, each of which can be individually tilted about an axis by applying a suitable localized electric field, or by employing piezoelectric actuation devices. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The required matrix addressing can be performed using suitable electronic means. In both of the situations described here above, the array of individually controllable elements can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference in their entireties.

A programmable LCD array can also be used. An example of such a construction is given in U.S. Pat. No. 5,229,872, which is incorporated herein by reference in its entirety.

It should be appreciated that where pre-biasing of features, optical proximity correction features, phase variation techniques and multiple exposure techniques are used, for example, the pattern "displayed" on the array of individually controllable elements can differ substantially from the pattern eventually transferred to a layer of or on the substrate. Similarly, the pattern eventually generated on the substrate can not correspond to the pattern formed at any one instant on the array of individually controllable elements. This can be the case in an arrangement in which the eventual pattern formed on each part of the substrate is built up over a given period of time or a given number of exposures during which the pattern on the array of individually controllable elements and/or the relative position of the substrate changes.

Although specific reference can be made in this text to the use of lithographic apparatus in the manufacture of ICs, it should be understood that the lithographic apparatus described herein can have other applications, such as, for example, the manufacture of DNA chips, MEMS, MOEMS, integrated optical systems, guidance and detection patterns for magnetic domain memories, flat panel displays, thin film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track (a tool that typically applies a layer of resist to a substrate and develops the exposed resist) or a metrology or inspection tool. Where applicable, the disclosure herein can be applied to such and other substrate processing tools. Further, the substrate can be processed more than once, for example in order to create a multi-layer IC, so that the term substrate used herein can also refer to a substrate that already contains multiple processed layers.

The terms "radiation" and "beam" used herein encompass all types of electromagnetic radiation, including ultraviolet (UV) radiation (e.g. having a wavelength of 365, 355, 248, 193, 157 or 126 nm) and extreme ultra-violet (EUV) radiation (e.g., having a wavelength in the range of 5-20 nm), as well as particle beams, such as ion beams or electron beams.

The term "projection system" used herein should be broadly interpreted as encompassing various types of projection systems, including refractive optical systems, reflective optical systems, and catadioptric optical systems, as appropriate, for example, for the exposure radiation being used, or for other factors such as the use of an immersion fluid or the use of a vacuum. Any use of the term "lens" herein can be considered as synonymous with the more general term "projection system."

The illumination system can also encompass various types of optical components, including refractive, reflective, and catadioptric optical components for directing, shaping, or controlling the beam of radiation, and such components can also be referred to below, collectively or singularly, as a "lens."

The lithographic apparatus can be of a type having two (e.g., dual stage) or more substrate tables (and/or two or more mask tables). In such "multiple stage" machines the additional tables can be used in parallel, or preparatory steps can be carried out on one or more tables while one or more other tables are being used for exposure.

The lithographic apparatus can also be of a type wherein the substrate is immersed in a liquid having a relatively high refractive index (e.g., water), so as to fill a space between the final element of the projection system and the substrate. Immersion liquids can also be applied to other spaces in the lithographic apparatus, for example, between the substrate and the first element of the projection system. Immersion techniques are well known in the art for increasing the numerical aperture of projection systems.

Further, the apparatus can be provided with a fluid processing cell to allow interactions between a fluid and irradiated parts of the substrate (e.g., to selectively attach chemicals to the substrate or to selectively modify the surface structure of the substrate).

Lithographic Projection Apparatus

Figure 1:
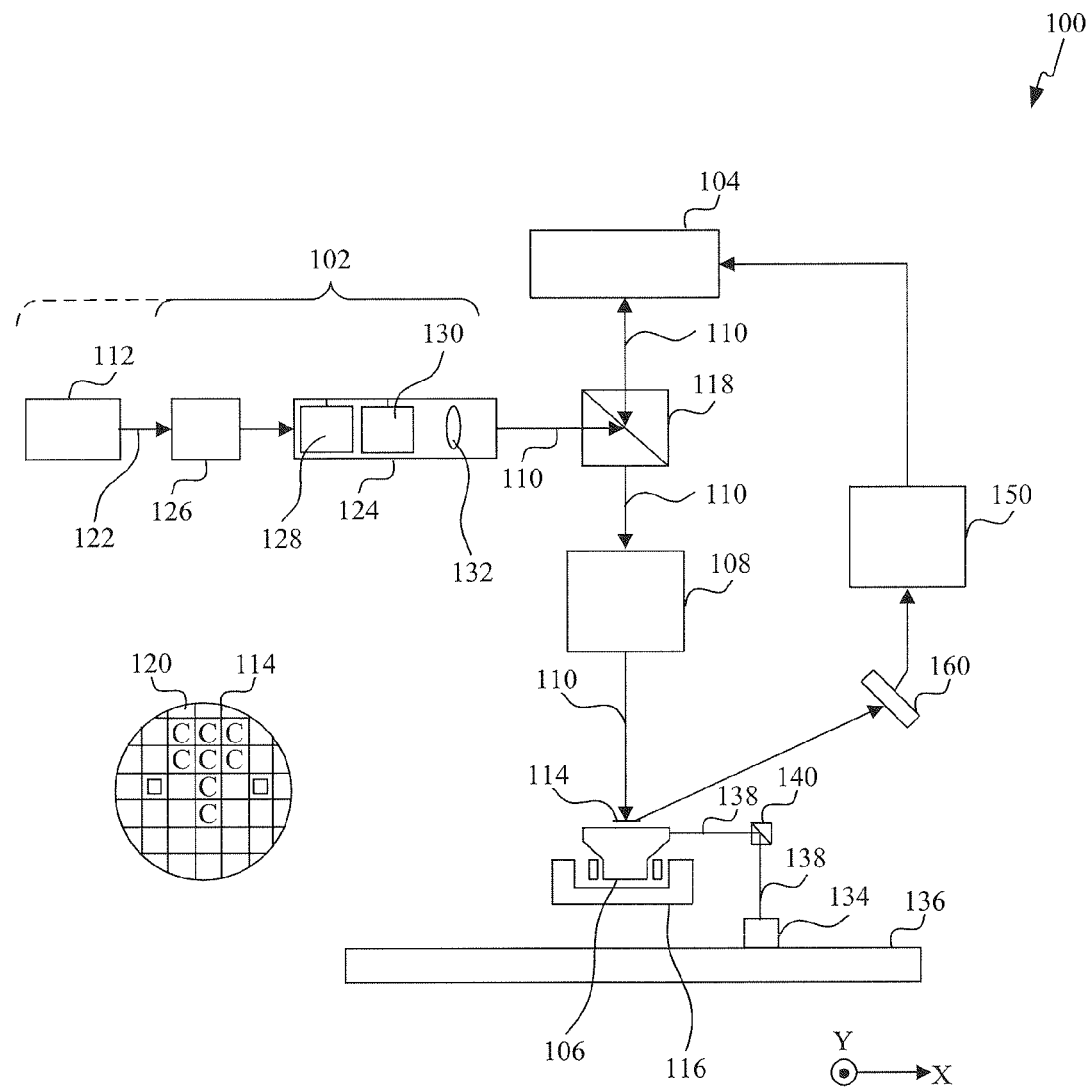
FIG. 1 depicts a lithographic apparatus, according to one embodiment of the present invention.

FIG. 1 schematically depicts a lithographic projection apparatus 100 according to an embodiment of the invention. Apparatus 100 includes at least a radiation system 102, an array of individually controllable elements 104, an object table 106 (e.g., a substrate table), and a projection system ("lens") 108.

Radiation system 102 can be used for supplying a beam 110 of radiation (e.g., UV radiation), which in this particular case also comprises a radiation source 112.

An array of individually controllable elements 104 (e.g., a programmable mirror array) can be used for applying a pattern to beam 110. In general, the position of the array of individually controllable elements 104 can be fixed relative to projection system 108. However, in an alternative arrangement, an array of individually controllable elements 104 can be connected to a positioning device (not shown) for accurately positioning it with respect to projection system 108. As here depicted, individually controllable elements 104 are of a reflective type (e.g., have a reflective array of individually controllable elements).

Object table 106 can be provided with a substrate holder (not specifically shown) for holding a substrate 114 (e.g., a resist coated silicon wafer or glass substrate) and object table 106 can be connected to a positioning device 116 for accurately positioning substrate 114 with respect to projection system 108.

Projection system 108 (e.g., a quartz and/or $CaF_2$ lens system or a catadioptric system comprising lens elements made from such materials, or a mirror system) can be used for projecting the patterned beam received from a beam splitter 118 onto a target portion 120 (e.g., one or more dies) of substrate 114. Projection system 108 can project an image of the array of individually controllable elements 104 onto substrate 114. Alternatively, projection system 108 can project images of secondary sources for which the elements of the array of individually controllable elements 104 act as shutters. Projection system 108 can also comprise a micro lens array (MLA) to form the secondary sources and to project microspots onto substrate 114.

Source 112 (e.g., an excimer laser) can produce a beam of radiation 122. Beam 122 is fed into an illumination system (illuminator) 124, either directly or after having traversed conditioning device 126, such as a beam expander, for example. Illuminator 124 can comprise an adjusting device 128 for setting the outer and/or inner radial extent (commonly referred to as σ-outer and σ-inner, respectively) of the intensity distribution in beam 122. In addition, illuminator 124 will generally include various other components, such as an integrator 130 and a condenser 132. In this way, beam 110 impinging on the array of individually controllable elements 104 has a desired uniformity and intensity distribution in its cross section.

It should be noted, with regard to FIG. 1, that source 112 can be within the housing of lithographic projection apparatus 100 (as is often the case when source 112 is a mercury lamp, for example). In alternative embodiments, source 112 can also be remote from lithographic projection apparatus 100. In this case, radiation beam 122 would be directed into apparatus 100 (e.g., with the aid of suitable directing mirrors). This latter scenario is often the case when source 112 is an excimer laser. It is to be appreciated that both of these scenarios are contemplated within the scope of the present invention.

Beam 110 subsequently intercepts the array of individually controllable elements 104 after being directed using beam splitter 118. Having been reflected by the array of individually controllable elements 104, beam 110 passes through projection system 108, which focuses beam 110 onto a target portion 120 of the substrate 114.

With the aid of positioning device 116 (and optionally interferometric measuring device 134 on a base plate 136 that receives interferometric beams 138 via beam splitter 140), substrate table 6 can be moved accurately, so as to position different target portions 120 in the path of beam 110. Where used, the positioning device for the array of individually controllable elements 104 can be used to accurately correct the position of the array of individually controllable elements 104 with respect to the path of beam 110, e.g., during a scan. In general, movement of object table 106 is realized with the aid of a long-stroke module (course positioning) and a short-stroke module (fine positioning), which are not explicitly depicted in FIG. 1. A similar system can also be used to position the array of individually controllable elements 104. It will be appreciated that beam 110 can alternatively/additionally be moveable, while object table 106 and/or the array of individually controllable elements 104 can have a fixed position to provide the required relative movement.

In an alternative configuration of the embodiment, substrate table 106 can be fixed, with substrate 114 being moveable over substrate table 106. Where this is done, substrate table 106 is provided with a multitude of openings on a flat uppermost surface, gas being fed through the openings to provide a gas cushion which is capable of supporting substrate 114. This is conventionally referred to as an air bearing arrangement. Substrate 114 is moved over substrate table 106 using one or more actuators (not shown), which are capable of accurately positioning substrate 114 with respect to the path of beam 110. Alternatively, substrate 114 can be moved over substrate table 106 by selectively starting and stopping the passage of gas through the openings.

Although lithography apparatus 100 according to the invention is herein described as being for exposing a resist on a substrate, it will be appreciated that the invention is not limited to this use and apparatus 100 can be used to project a patterned beam 110 for use in resistless lithography.

The depicted apparatus 100 can be used in five modes:

1. Step mode: the entire pattern on the array of individually controllable elements 104 is projected in one go (i.e., a single "flash") onto a target portion 120. Substrate table 106 is then moved in the x and/or y directions to a different position for a different target portion 120 to be irradiated by patterned beam 110.

2. Scan mode: essentially the same as step mode, except that a given target portion 120 is not exposed in a single "flash." Instead, the array of individually controllable elements 104 is movable in a given direction (the so-called "scan direction", e.g., the y direction) with a speed v, so that patterned beam 110 is caused to scan over the array of individually controllable elements 104. Concurrently, substrate table 106 is simultaneously moved in the same or opposite direction at a speed V=Mv, in which M is the magnification of projection system 108. In this manner, a relatively large target portion 120 can be exposed, without having to compromise on resolution.

3. Pulse mode: the array of individually controllable elements 104 is kept essentially stationary and the entire pattern is projected onto a target portion 120 of substrate 114 using pulsed radiation system 102. Substrate table 106 is moved with an essentially constant speed such that patterned beam 110 is caused to scan a line across substrate 106. The pattern on the array of individually controllable elements 104 is updated as required between pulses of radiation system 102 and the pulses are timed such that successive target portions 120 are exposed at the required locations on substrate 114. Consequently, patterned beam 110 can scan across substrate 114 to expose the complete pattern for a strip of substrate 114. The process is repeated until complete substrate 114 has been exposed line by line.

4. Continuous scan mode: essentially the same as pulse mode except that a substantially constant radiation system 102 is used and the pattern on the array of individually controllable elements 104 is updated as patterned beam 110 scans across substrate 114 and exposes it.

5. Pixel Grid Imaging Mode: the pattern formed on substrate 114 is realized by subsequent exposure of spots formed by spot generator 130 that are directed onto array 104. The exposed spots have substantially a same shape. One substrate 114 the spots are printed in substantially a grid. In one example, the spot size is larger than a pitch of a printed pixel grid, but much smaller than the exposure spot grid. By varying intensity of the spots printed, a pattern is realized. In between the exposure flashes the intensity distribution over the spots is varied.

Combinations and/or variations on the above described modes of use or entirely different modes of use can also be employed.

Figure 2:
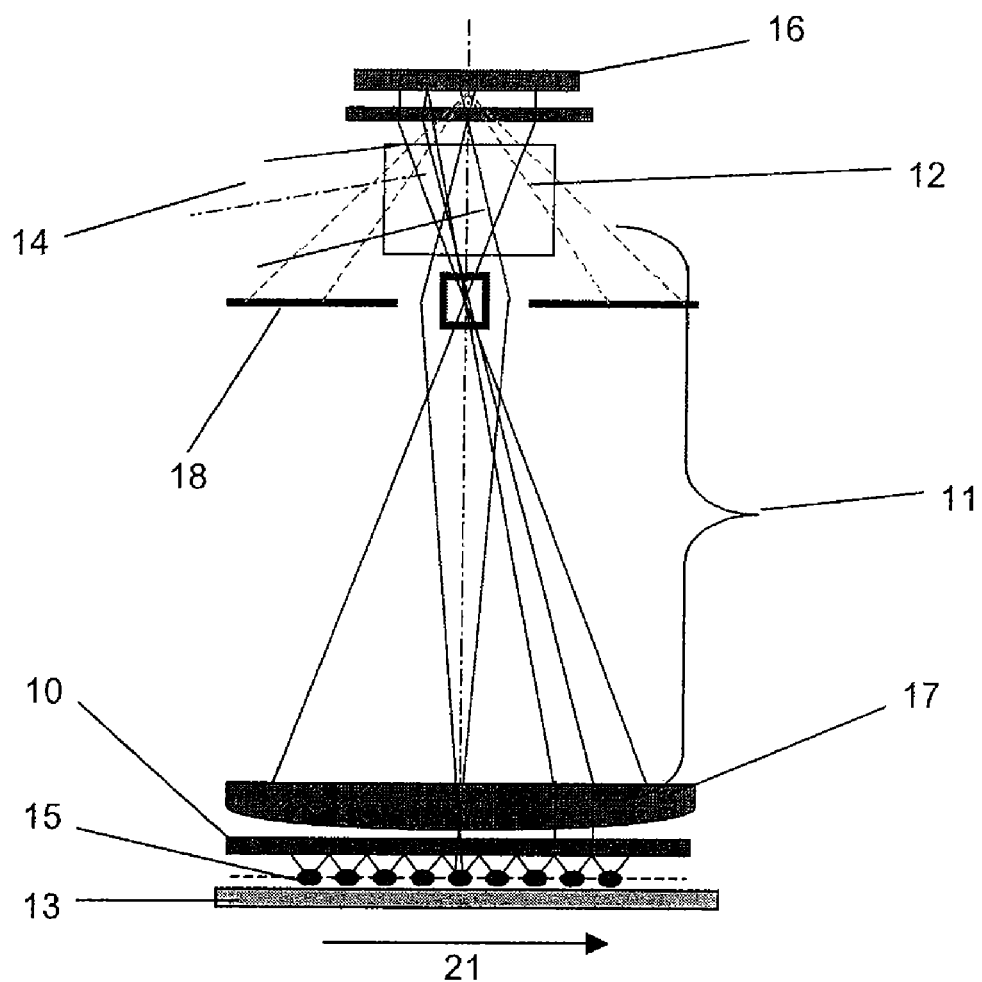
FIG. 2 shows a maskless imaging system, according to one embodiment of the present invention.

FIG. 2 represents a part of an apparatus 100, according to one embodiment of the present invention. In particular, it shows a contrast device in the form of an array 16 of individually controllable elements, an array of focusing elements in the form of a micro lens array (MLA) 10 for directing radiation onto a substrate 13, projection elements of a projection system 11 for directing radiation onto the MLA 10 by way of a field lens 17, and a beam splitter 12 illuminated by oblique radiation 14. In this example, the beam splitter is arranged within the set of projection elements, such that it diverts the projection beam of radiation onto the reflective array of individually controllable elements. The reflected radiation from the individually controllable elements then passes straight through the beam splitter 12 into the remainder of the projection system.

In an alternative arrangement, the array of individually controllable elements is directly illuminated in a transmissive configuration.

Figure 6:
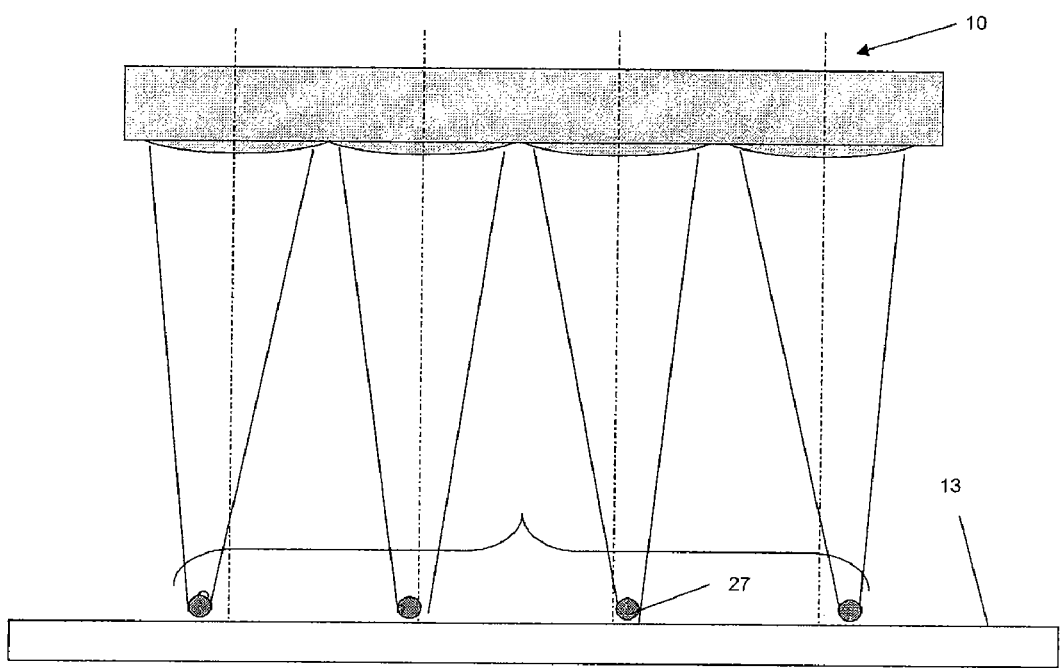
Figure 7:
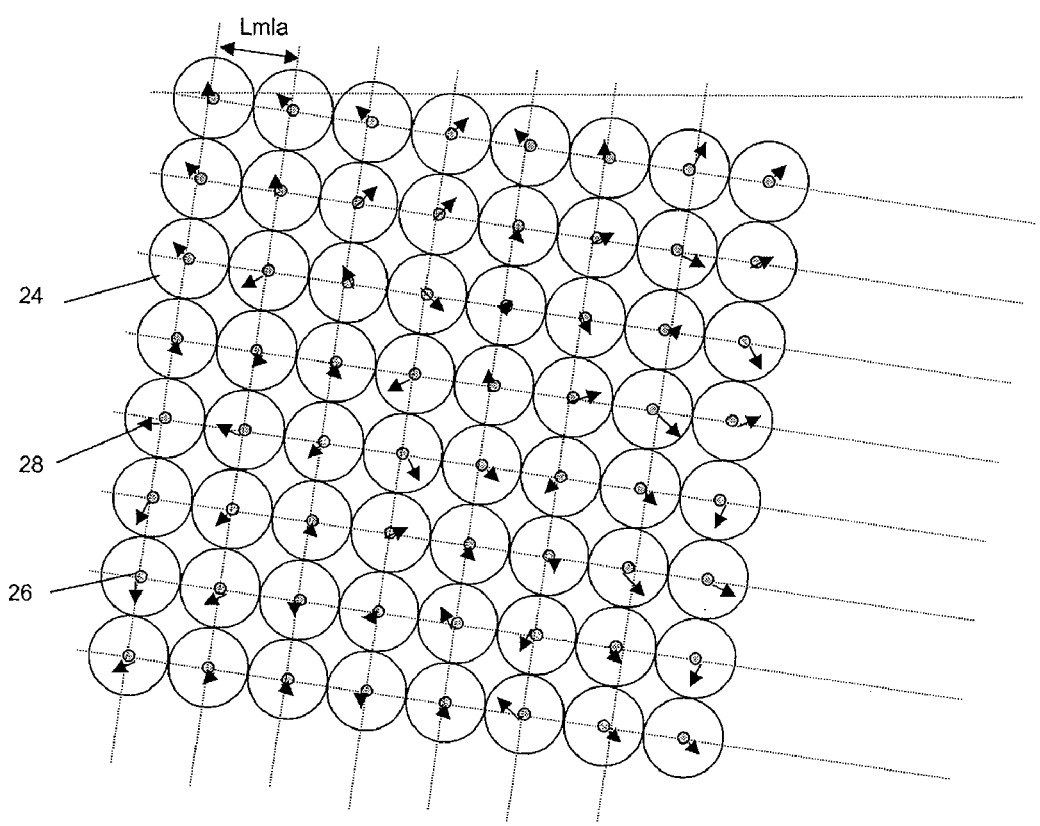

In the embodiment shown in FIGS. 6 and 7, the MLA 10 comprises a body of transparent material having a flat upper surface and a lower surface shaped to define a plurality of lenses, although other shapes of MLA can be provided in alternative embodiments of the invention. In practice, the MLA can comprise as many as one million microlenses or more.

Returning to FIG. 2, the controllable elements of the array 16 in this example are mirrors whose tilt angles can be set by application of an appropriate control signal from a control system. It will be appreciated, however, that other forms of controllable elements can be used in alternative embodiments. For example, in certain embodiments the controllable elements can be movable diffraction gratings. Some of the controllable elements can be set to a nominal "white" position, while other controllable elements can be set to a nominal "black" position, so that the array 16 of elements can impart a pattern to the projection beam. The patterned beam reflected from the array 16 of controllable elements is then projected onto a target plane by the projection system 11, which comprises a beam expander arranged to receive a substantially parallel patterned beam from the controllable array and focus that beam such that it passes through an aperture 18. The patterned beam is then expanded by a field lens 17 into a substantially parallel beam which is delivered to the MLA 10. Each of the microlenses of the MLA 10 receives and focuses a respective portion of the patterned beam, forming a corresponding spot 15 of radiation on the target plane. In one example, the portion of the patterned beam incident on each microlens should correspond to one or more of the controllable elements of the array 16.

Each of the lenses of the MLA 10 focuses the radiation directed onto it to an associated area on the substrate. The intensity of the radiation in each area is dependant on the sum of the intensities of the portions of the patterned beam from each of the individually controllable elements associated with that lens. Therefore, the radiation at the area on the substrate associated with the microlens is dependant on the intensity of the radiation propagating from each of the individually controllable elements. Each of the individually controllable elements can be set to a plurality of states. In one example, the elements can be set to either direct radiation onto the associated focusing element or no radiation. Therefore, it has two states, namely full intensity and zero intensity.

For example, where there are three individually controllable elements associated with each microlens, four different levels of radiation intensity can be produced at the area on the substrate to which the radiation from one microlens is directed. Specifically, all of the elements can be set to zero radiation, all the elements can be set to full intensity, only one of the individually controllable elements can be set to full intensity, or two of the individually controllable elements can be set to full intensity. Each of the microlenses of the MLA 10 focuses the radiation directed onto it to an associated imaging spot 15 on the substrate 13, and each imaging spot can be set to a plurality of states depending on the states of the associated controllable elements.

In one example, in addition to the fully on and fully off states corresponding to high and low intensity transmission levels, the controllable elements can be set to two or more intermediate states in which radiation at an intensity between the high intensity level and the low intensity level is transmitted. Each individually controllable element can, for example, be capable of generating up to 256 different intensity levels.

In this example, the individually controllable elements associated with each lens of the MLA 10 can be configured to transmit a different proportion of the radiation incident on them to the lens in each of their corresponding states.

In one example, the apparatus can be configured such that the radiation that is incident on each of the individually controllable elements associated with one lens has a different intensity level.

Figure 3:
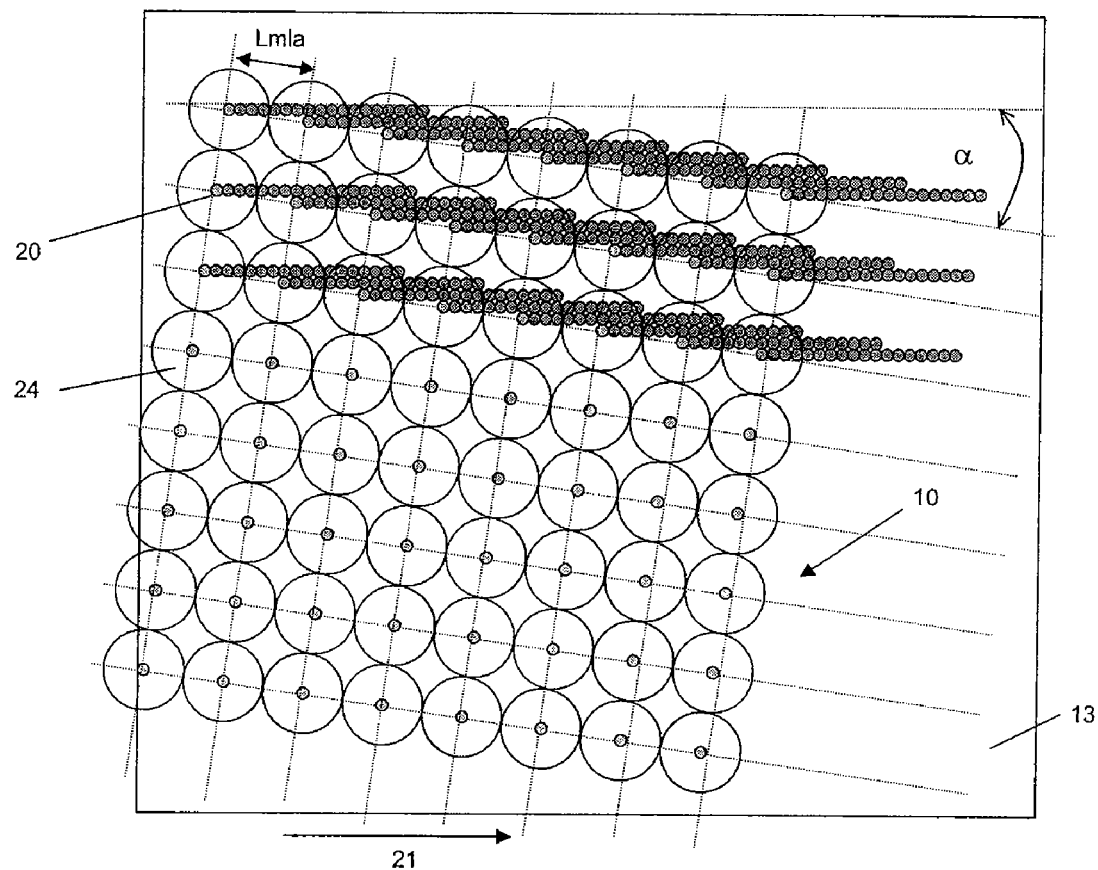
FIG. 3 shows an exposure principle used the system of FIG. 2 and shows how arrays of imaging spots build up over time, according to one embodiment of the present invention.

Referring to FIG. 3, the exposure of the substrate 13 is effected by moving the substrate table at a constant velocity in a scan direction 21 as the substrate is illuminated by the array 20 of imaging spots so that each imaging spot is caused to scan a line across the substrate. The pattern applied to the MLA can be updated as required between pulses of the radiation system, and the pulses timed such that successive target portions on the substrate are exposed at the required locations. Consequently, the projection beam is caused to scan across the substrate to expose the complete pattern for a strip of the substrate.

The array 20 of imaging spots comprises rows which are inclined at an angle $\alpha$ to the scan direction 21. This has the effect of causing the lines scanned by the imaging spots to be offset relative to one another in such a manner as to cause the whole of the substrate to be scanned by the imaging spots. A region of the substrate scanned by the imaging spots at a particular time during the exposure process is shown in FIG. 3. In this example, the imaging spots are shown superimposed on the individual lenses 24 of the MLA spaced at a pitch Lmla.

Figure 4:
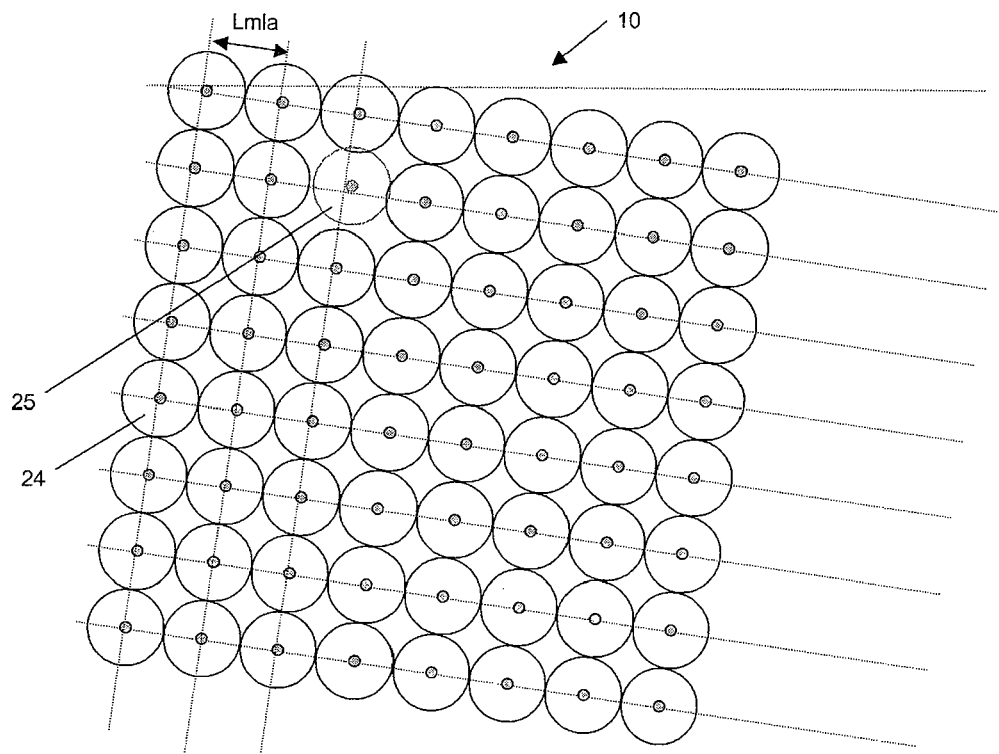

FIG. 4 shows the MLA with one of the microlenses having a positional error, according to one embodiment of the present invention. This causes its position to be displaced relative to the ideal grid as shown at 25

Figure 5:
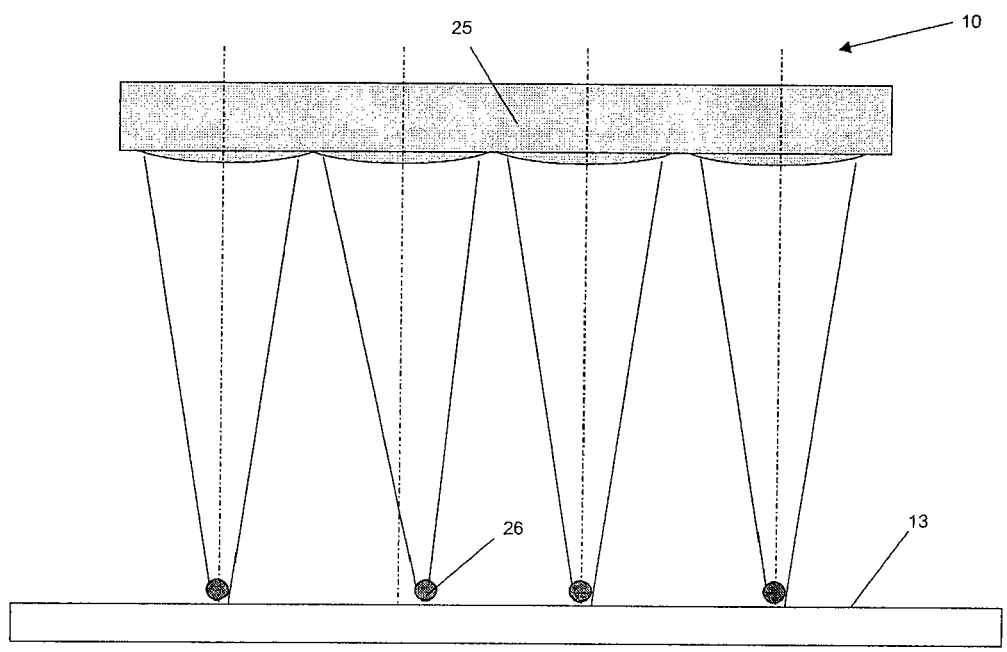

FIG. 5 is a section through a MLA 10 showing the positional error in the corresponding imaging spot 26 as a result of the positional error of the microlens 25, according to one embodiment of the present invention. Alternatively positional imaging spot errors can be caused as a result of a magnification error in the X direction or in the Y direction or in both X and Y direction.

FIG. 6 shows the effect on the positioning of the imaging spots 27 of a magnification error in the MLA 10, according to one embodiment of the present invention.

FIG. 7 shows an MLA 10 with arrows 28 illustrating the vector errors associated with the imaging spots 26, according to one embodiment of the present invention. In one example, almost every MLA imaging spot will have a position error.

In these patterning positional error conditions, the resulting positioning errors of the imaging spots can be compensated for by a patterning device calibration procedure. For example, a procedure in which the positioning errors of the imaging spots are measured by a sensor array 160 (e.g., a photodiode array) and the nominal intensity of each spot is calibrated. In one embodiment, sensor array 160 is the measurement device providing input to the error compensator 150. In this example, the positional errors relative to the ideal grid positions are determined in a computer program using an MLA error matrix Emla (i,j), where i and j denote the positions of each microlens within the grid having pitches Lmlax and Lmlay in the X and Y directions. In this example, an intensity correction matrix Imla (m,n) can be determined as a function of these values, as well as a function of a velocity v of movement of the substrate holder relative to the MLA, a refresh rate f (Hz) of the patterning device, and the tilt angle $\alpha$ between the rows of the MLA and the scanning direction.

$$Imla(i,j)=F\{Emla(i,j),Lmlax,Lmlay,v,f,\alpha\}.$$

This function also depends on the actual pattern to be imaged.

In one example, the positioning error of an imaging spot can be corrected by adjusting the grey level of adjacent spots. For example, this can be done using a spot compensation procedure in which the nominal position of each spot is calculated, and the required grey level to be applied to each spot is determined on the basis of the spot error lookup table. In other words, the compensation for the positioning error is made by varying the intensity values of the relevant image spots relative to the values they would have in the absence of such error compensation.

FIGS. 8, 9 and 10 show the intensity of an array of eleven imaging spots plotted against the position of each imaging spot in the array, according to various embodiments of the present invention.

FIG. 8 is a graph of such an array in which none of the imaging spots has a position error. Each of the spots has the same intensity as denoted by the intensity peaks 40 associated with the spots. Also shown in this graph is the curve 41 showing the overall intensity of the array, and it will be noted that this curve 41 has a flat top.

FIG. 9 is a graph of such an array in which the middle imaging spot has a position error of about 0.1 μm to the right, so that each of the spots has the same intensity as before, but the intensity peak 42 associated with the middle imaging spot has a position error of about 0.1 μm to the right. This causes the curve 43 showing the overall intensity of the array to have an uneven top.

FIG. 10 is a graph of such an array in which the spot position error of the middle imaging spot has been compensated for by applying suitable error correction values to the adjacent imaging spots. For example, the intensity of two of the adjacent spots has been increased to provide peaks 44 and 46 of increased intensity and the intensity of one of the adjacent spots has been decreased to provide a peak 45 of decreased intensity. These error correction values applied to the adjacent imaging spots cause the curve 47 showing the overall intensity of the array to have a substantially even top, thus preventing the image from being compromised. The correction value are then used during normal operation to provide compensation for errors.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all, exemplary embodiments of the present invention as contemplated by the inventor(s), and thus, are not intended to limit the present invention and the appended claims in any way.

What is claimed is:

1. An apparatus, comprising:
a pattern generator configured to emit a patterned beam; and
a projection system configured to project the patterned beam onto a target portion of a substrate and comprising a micro lens array configured to produce image spots on the target portion of the substrate,
wherein the pattern generator is driven by a drive signal based on error correction values to vary an intensity of respective ones of the image spots adjacent to respective ones of the image spots manifesting errors caused by the projection system, thereby compensating for the errors in the projection system.

2. The apparatus of claim 1, wherein:
the pattern generator comprises an array of individually controllable elements; and
the intensity of radiation transmitted by at least some of the individually controllable elements of the array is varied by the drive signal to compensate for the effect of errors in the projection system.

3. The apparatus of claim 1, wherein the varied intensity of respective parts of the patterned beam corrects for positional errors of the micro lens array.

4. The apparatus of claim 3, wherein the positional errors are substantially less than about 20 nm.

5. The apparatus of claim 1, wherein the varied intensity of respective parts of the patterned beam corrects for magnification errors of the micro lens array.

6. The apparatus of claim 1, wherein the pattern generator is disposed in an optical path of the beam of radiation between the illumination system and the substrate.

7. The apparatus of claim 1, further comprising:
a scanning system configured to move a substrate table supporting the substrate during projection of the patterned beam onto the target portion of the substrate.

8. The apparatus of claim 7, wherein:
the pattern generator comprises an array of controllable elements arranged in parallel rows; and
the scanning system is configured to move the substrate table in a scanning direction with an angle, $\alpha$, relative to the parallel rows.

9. The apparatus of claim 1, further comprising:
an error compensator configured to supply the error correction values.

10. The apparatus of claim 9, wherein the error compensator comprises:
a sensor array configured to monitor errors in a positioning of the image spots of the micro lens array.

11. The apparatus of claim 10, wherein the sensor array comprises a photodiode array.

12. The apparatus of claim 9, wherein the error compensator is configured to determine an intensity correction matrix as a function of the positions of the image spots of the micro lens array and the errors in the positioning of the image spots.

13. The apparatus of claim 12, wherein the function further comprises at least one of:
an error matrix;
a first grid pitch in a first direction;
a second grid pitch in a second direction;
a velocity of movement of the substrate relative to the micro lens array;
a refresh rate of the patterning arrangement; and
an a tilt angle between rows of the micro lens array and a scanning direction.

14. A method, comprising:
producing a patterned beam of radiation using a pattern generator;
using a micro lens array to project image spots of the patterned beam of radiation onto a target portion of a substrate;
detecting errors in a projection system; and
supplying drive signals to the pattern generator based on the detected errors to vary an intensity of respective ones of the image spots adjacent to respective ones of the image spots manifesting errors caused by the projection system, thereby compensating for the effect of the errors in the projection system.

15. The method of claim 14, wherein:
the beam is patterned using an array of individually controllable elements; and
the intensity of radiation transmitted by at least some of the controllable elements of the array of individually controllable elements is varied in order to compensate for the effect of errors in the projection system.

16. The method of claim 14, further comprising:
correcting positional errors in parts of the micro lens array.

17. The method of claim 14, further comprising:
correcting magnification errors in parts of the micro lens array.

18. The method of claim 14, further comprising:
moving a substrate table supporting the substrate during the projection of the beam onto the target portion of the substrate.

19. The method of claim 18, wherein:
the pattern generator comprises an array of controllable elements arranged in parallel rows; and
the substrate table is moved in a scanning direction with an angle, $\alpha$, relative to the parallel rows during projection of the beam onto the target portion of the substrate.

20. The method of claim 14, wherein varying the intensity of the respective portions of the patterned beam results in an overall uniform intensity of the patterned beam.

21. An apparatus, comprising:
a programmable mirror array configured to emit a patterned beam; and
a projection system configured to project image spots of the patterned beam onto a target portion of a substrate, each image spot being based on two or more mirrors from the programmable mirror array, and
wherein the programmable mirror array is driven by a drive signal based on error correction values to vary an intensity of the image spots adjacent to the image spots manifesting errors caused by the projection system, thereby compensating for the errors in the projection system.

22. A method, comprising:
producing a patterned beam of radiation using a programmable mirror array;
projecting image spots of the patterned beam of radiation onto a target portion of a substrate, each image spot being based on two or more mirrors from the programmable mirror array;
detecting errors in a projection system; and
supplying drive signals to the programmable mirror array based on the detected errors to vary an intensity of the image spots adjacent to the image spots manifesting errors caused by the projection system, thereby compensating for the effect of the errors in the projection system.

* * * * *